(12) United States Patent
Yamasaki

(10) Patent No.: US 6,548,398 B1
(45) Date of Patent: Apr. 15, 2003

(54) PRODUCTION METHOD OF SEMICONDUCTOR DEVICE AND PRODUCTION DEVICE THEREFOR

(75) Inventor: Hideaki Yamasaki, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/049,282

(22) PCT Filed: Aug. 11, 2000

(86) PCT No.: PCT/JP00/05411

§ 371 (c)(1),
(2), (4) Date: Feb. 11, 2002

(87) PCT Pub. No.: WO01/13415

PCT Pub. Date: Feb. 22, 2001

(30) Foreign Application Priority Data

Aug. 11, 1999 (JP) .............................. 11-228048

(51) Int. Cl.⁷ .......................................... H01L 21/4763
(52) U.S. Cl. ..................... 438/622; 438/625; 438/629; 438/642; 438/648; 438/652; 438/656; 438/658; 438/680; 438/685
(58) Field of Search .................... 438/622, 625, 438/629, 642, 648, 652, 656, 658, 680, 685

(56) References Cited

U.S. PATENT DOCUMENTS

| | | |
|---|---|---|
| 4,716,050 A | 12/1987 | Green et al. |
| 4,789,648 A | 12/1988 | Chow et al. |
| 5,008,217 A | 4/1991 | Case et al. |
| 5,043,299 A | 8/1991 | Chang et al. |
| 5,506,177 A * | 4/1996 | Kishimoto et al. .......... 437/195 |
| 6,191,021 B1 * | 2/2001 | Fuller et al. ................. 438/648 |

FOREIGN PATENT DOCUMENTS

| | | | |
|---|---|---|---|
| JP | 2-38568 | 2/1990 | |
| JP | 3-180040 | * 8/1991 | ................. 438/656 |
| JP | 6-35657 | 5/1994 | |
| JP | 9-172076 | 6/1997 | |
| JP | 10-308447 | 11/1998 | |
| JP | 11-176791 | 7/1999 | |

OTHER PUBLICATIONS

PCT Notification of Transmittal of Copies of Translation of the International Preliminary Examination Report (PCT/IB/338) issued for PCT/JP00/05411.
International Preliminary Examination Report (PCT/IPEA/409) (translated) issued for PCT/JP00/05411.

* cited by examiner

Primary Examiner—John F. Niebling
Assistant Examiner—Lynne A. Gurley
(74) Attorney, Agent, or Firm—Smith, Gambrell & Russell, LLP (57) ABSTRACT

A manufacturing method of a semiconductor device of the invention is a method of manufacturing a semiconductor device by forming a plurality of films on an insulating layer which has a surface in which a recess portion is partially formed. The method includes: a base-metal-film forming step of forming a base-metal film including a metal having a high melting point on the surface of the insulating layer including an inside surface of the recess portion, a surface-processing step of processing a surface of the base-metal film by means of an organic solvent having an OH-group, and a metal-for-circuit depositing step of depositing a metal for a circuit on the processed surface of the base-metal film by means of a CVD method in such a manner that at least a part of or the whole of the recess portion is filled up.

9 Claims, 8 Drawing Sheets

EXAMPLE 1 (SURFACE PROCESS WAS CONDUCTED)

(A)

COMPARISON 1 (SURFACE PROCESS WAS NOT CONDUCTED)

PRODUCTION METHOD OF SEMICONDUCTOR DEVICE AND PRODUCTION DEVICE THEREFOR

FIELD OF THE INVENTION

This invention relates to a method of manufacturing a semiconductor device and a unit of manufacturing a semiconductor device, wherein a metallic circuit is formed in a recess portion, which includes: a minute through-hole for connecting circuit layers, a minute contact-hole for connecting a circuit layer and a diffusion layer (doped layer) such as a transistor device, and a narrow groove for forming a metallic wire. In particular, this invention relates to a method of manufacturing a semiconductor device and a manufacturing unit for carrying out a part of the method, wherein a good filling can be achieved by controlling a deposition characteristic of an early stage of a deposition process, in which a metal for a circuit is deposited on a base-metal film, which has been pre-deposited in a recess portion and on a plane in which the recess portion is formed, by using a CVD (Chemical Vapor Deposition) method. The term of base-metal film used in the specification also includes any base-metal compound film.

BACKGROUND OF THE INVENTION

As a semiconductor device being a semiconductor integrated circuit, for example an IC or an LSI, is made more minute, a contact-hole for connecting an impurity-diffusion layer (doped layer) and a metallic-circuit layer and/or a through-hole for connecting metallic-circuit layers, which holes are formed on a surface of a semiconductor substrate, are also made more minute. That is, an aspect ratio (a ratio of an open width with respect to a depth of the hole) of the contact-hole and/or the through-hole is increased.

A method of depositing a metal for a circuit such as an aluminum alloy by means of a sputtering method is conventionally used as an art of obtaining an electric connection by filling such a hole with a metal for a circuit. However, it is difficult to satisfactorily deposit the metal for a circuit in such a minute hole by means of a sputtering method. Thus, it has been studied to adopt a CVD method that is superior in a deposition characteristic into a minute hole.

The CVD method includes: a selective deposition CVD method (selective), wherein a non-electric-conductive area (for example, a surface of an insulating layer formed on a base-metal circuit) and a electric-conductive area (for example, a surface of a base-metal film exposed at a bottom of a hole formed in the insulating layer) are formed on a surface of a substrate, and then a metal for a circuit is deposited only on the electric-conductive area; and a whole-surface deposition CVD method (blanket), wherein a base-metal film such as a titanium nitride film is formed on the whole surface of the substrate including the inside of the hole and the surface of the insulating layer around the hole, and then a metal for a circuit is deposited on the whole surface.

Among them, the whole-surface deposition CVD method has an advantage that a sensitiveness to a state of the surface of the substrate with respect to the deposition is low, so that the method can be used stably as a mass-production art. In addition, the whole-surface deposition CVD method has an advantage that a metal film for a circuit deposited on the insulating layer outside the hole can be patterned to be used as a or more metallic wires.

Tungsten that can be made from tungsten fluoride ($WF_6$) and aluminum that can be made from any organic aluminum compound are typical as an electric conductive metal that can be deposited by means of the above CVD methods. In particular, aluminum is superior because its electric resistance is one third as much as that of tungsten so that a low-resistance circuit element can be formed. In addition, copper and gold whose electric resistance is further lower than that of aluminum can be deposited by means of the CVD methods.

Following two methods are known as an art to fill a hole with aluminum by means of the whole-surface deposition CVD method.

In a first method, a deposition unit is used wherein a CVD reacting chamber and a sputtering chamber are connected to each other via a transferring chamber that is shut off from the atmosphere. At first, titanium nitride is deposited on the whole surface of a substrate, in which a hole has been formed, in the sputtering chamber. Then, the substrate is transferred into the CVD chamber through the transferring chamber without being exposed to the atmosphere. Next, aluminum is deposited by means of a CVD method using triisobutyl aluminum (for example, see U.S. Pat. No. 5,008, 217). However, in practice, the sputtering chamber and the CVD chamber are very different in their using gas and their operating pressure. Thus, it is technically difficult to both form and use the unit in which the sputtering chamber and the CVD chamber are united.

In a second method, titanium nitride is deposited on the whole surface of a substrate, in which a hole has been formed, by means of a sputtering method. The substrate is introduced into a CVD unit. Then, the substrate is allowed to come in contact with the atmosphere. After that, aluminum is deposited by means of a CVD method using dimethyl-aluminum-hydride (for example, see 1993 VLSI Multilevel Interconnection Conference Symposium p.463). In the case, if a substrate temperature at a CVD process is set to a value that can achieve a high deposition rate, aluminum deposited on the insulating layer outside the hole may cover an opening at an upper portion of the hole, before the minute hole is filled up. That is, a hollow void may be formed in the hole, so that a good filling can not be achieved. Thus, in order to achieve a good filling, it is necessary to lower the substrate temperature at the CVD process. However, in that case, the deposition rate is also lowered, so that the efficiency of the mass production is lowered.

On the other hand, the following method is known regarding the case wherein a hole is filled with tungsten by means of the selective deposition CVD method.

In this method, an unit is used wherein a cleaning chamber and a CVD chamber are connected to each other via a transferring chamber that is shut off from the atmosphere. At first, a surface such as a metallic surface exposed at a bottom of the hole is cleaned by plasma including hydrogen and/or halogen gas in the cleaning chamber. The substrate is transferred into the CVD chamber through the transferring chamber without being exposed to the atmosphere. After that, tungsten is deposited selectively only in the hole by means of a CVD method using tungsten fluoride. For example, U.S. Pat. No. 5,043,299 discloses an art to remove contaminants such as water vapor or any oxide attached in the atmosphere, which may obstruct the deposition of tungsten, by using plasma, regarding a surface such as a metallic surface exposed at a bottom of a hole.

In addition, when a metallic circuit is formed, a conventional method has been used wherein: a metal for a circuit such as an aluminum alloy is deposited on the whole upper surface of a base insulating layer by means of a sputtering method, an unnecessary part thereof is removed by means of a photo lithographic art and a dry etching art, and hence a metallic circuit layer including a desired circuit pattern is formed. However, as the metallic circuit becomes so minute that it becomes more difficult to carry out the dry etching process to the circuit layer, another method has been proposed wherein: narrow grooves corresponding to a metallic circuit pattern (grooves for a circuit) are formed in the surface of the insulating layer in advance, and a metal for a circuit is formed in the grooves (for example, see U.S. Pat. No. 4,789,648). In the case too, it is preferable that a metal for a circuit for forming a circuit layer is deposited by means of a CVD method superior in an ability to fill narrow grooves therewith.

In addition, as the JP publication No.6-35657 discloses, there is another method of depositing an aluminum film, wherein a surface activation layer of a hydroxyl group (in which a hydrogen ion in the hydroxyl group is replaced with an organic, inorganic or organic-metallic ligand group or with a metallic ion such as a Cr ion or an Al ion) is formed on a surface of a substrate by treating said surface.

Thus, in order to fill up a narrow hole or a narrow groove for a circuit formed in an insulating layer with a metal for a circuit, it is preferable to use a CVD method superior in step-coverage performance. However, the conventional CVD methods have a large number of steps and/or need complicated steps. That is, a depositing method that achieves sufficient filling performance with simple steps has not been proposed yet.

SUMMARY OF THE INVENTION

This invention is intended to solve the above problems.

The object of this invention is to provide a manufacturing method and a manufacturing unit of a semiconductor device, that can satisfactorily fill a minute hole or a minute groove for a circuit with a metal for a circuit and that can form a circuit layer, with a small number of and simple steps.

The inventors conducted various experiments and analysis, about a previous step using an organic solvent having an OH-group and about a CVD step conducted thereafter.

As a result, the inventors have found that the condition of the previous step may have a great effect on the deposition of a metal for a circuit in the CVD step.

The invention is a method of manufacturing a semiconductor device by forming a plurality of films on an insulating layer which has a surface in which a recess portion is partially formed, the method comprising: a base-metal-film forming step of forming a base-metal film including a metal having a high melting point on the surface of the insulating layer including an inside surface of the recess portion; a surface-processing step of processing a surface of the base-metal film by means of an organic solvent having an OH-group; and a metal-for-circuit depositing step of depositing a metal for a circuit on the processed surface of the base-metal film by means of a CVD method in such a manner that at least a part of or the whole of the recess portion is filled up.

According to the above feature, substances stuck on the surface such as contaminants can be effectively removed by conducting the surface-process by means of the organic solvent having an OH-group, before depositing the metal for a circuit by means of the CVD method. Thus, the minute recess portion can be filled up at least satisfactorily. In addition, if the depositing step is continued, it also becomes possible to form a circuit layer (a deposited layer) having a uniform thickness.

In addition, preferably, the method includes: a circuit-layer forming step of forming a circuit layer by depositing a metal for a circuit by means of a sputtering method or a electroplating method, after the metal-for-circuit depositing step.

Preferably, the method of forming the metal for a circuit can be switched from the CVD method to a sputtering method. In the case, the whole depositing time can be shortened to improve the throughput, compared with a case wherein all necessary thickness is deposited by means of the CVD method. In addition, a sputtered film that is more durable to electromigration or the like can be formed as the circuit layer.

Alternatively, after the metal-for-circuit depositing step, a removing step of removing the deposited metal layer while leaving the metal for a circuit filling the recess portion and a new circuit-layer forming step of forming a circuit layer by depositing a metal for a circuit on the whole surface by means of a sputtering method or a electroplating method may be conducted.

In the case, the deposited layer is removed while leaving the metal for a circuit deposited to fill the recess portion by the CVD method, and a new circuit layer may be formed by the sputtering method. That is, the former circuit layer can be replaced with the metal for a circuit that has a better film quality.

In addition, in the surface-processing step, it is preferable that a gaseous organic solvent is adapted to come in contact with the base-metal film. Alternatively, in the surface-processing step, a liquid organic solvent is adapted to come in contact with the base-metal film.

The recess portion may be a contact-hole formed in the insulating layer. Alternatively, the recess portion may be a through-hole formed in the insulating layer. Alternatively, the recess portion may be a groove for a circuit formed in the insulating layer.

For example, the metal for a circuit is Al or Cu.

In addition, the invention is a manufacturing unit of a semiconductor device comprising: a surface-processing unit that causes a surface of a semiconductor device material to come in contact with an organic solvent having an OH-group to conduct a surface-process; a CVD unit that deposits a metal for a circuit on the surface-processed surface of the semiconductor device material by means of a CVD method; and a transferring chamber communicating with the surface-processing unit and the CVD unit.

DESCRIPTION OF THE PREFERRED EMBODIMENT

An embodiment of a manufacturing method and a manufacturing unit of a semiconductor device according to the invention is explained in detail based on attached drawings.

Figure 1:
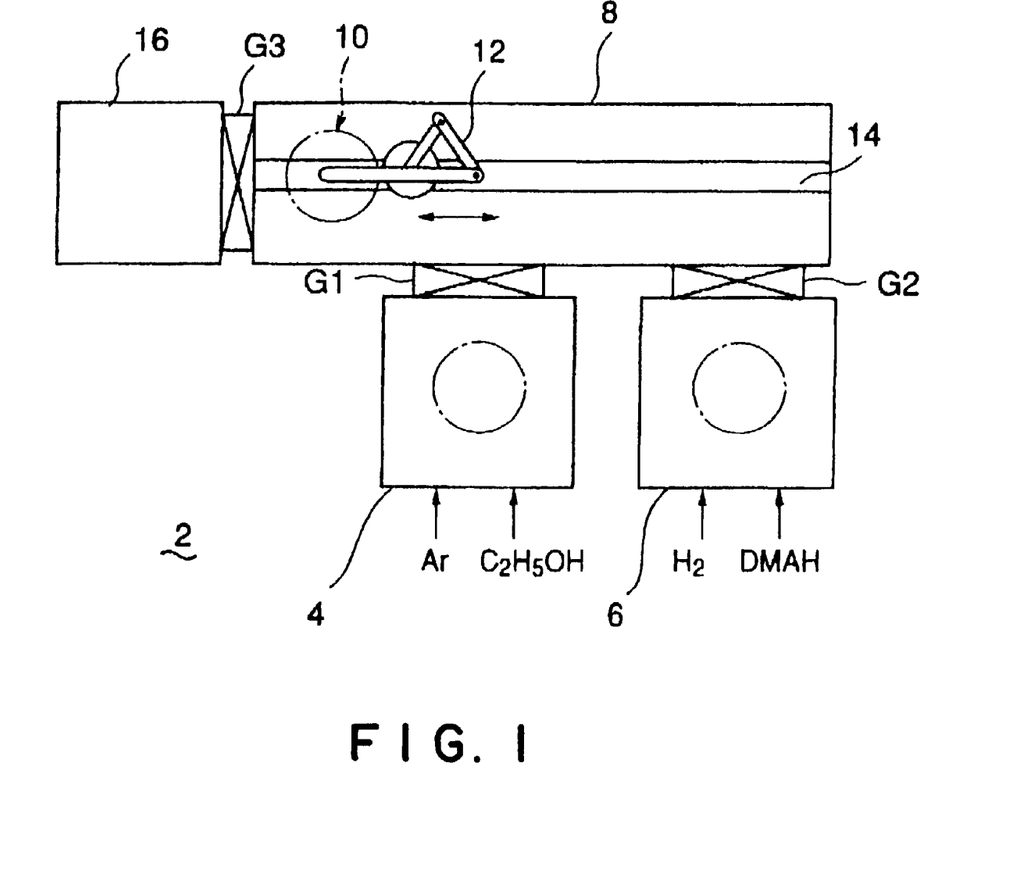
FIG. 1 is a schematic view showing an example of a manufacturing unit for carrying out a part of steps of a method according to the invention.

FIG. 1 is a schematic view that shows a manufacturing unit for carrying out a part of steps of a method according to the invention.

At first, the method is a method of manufacturing a semiconductor device by forming a plurality of films on a surface of a semiconductor device material, which has an insulating layer that has a surface in which a recess portion is partially formed, the method comprising: abase-metal-film forming step of forming a base-metal film including a metal having a high melting point on the surface of the insulating layer including an inside surface of the recess portion; a surface-processing step of processing a surface of the base-metal film by means of an organic solvent having an OH-group; and a metal-for-circuit depositing step of depositing a metal for a circuit on the processed surface of the base-metal film by means of a CVD method in such a manner that at least a part of or the whole of the recess portion is filled up.

The semiconductor device material means a semiconductor substrate whose uppermost layer is an insulating layer. A predetermined recess portion such as a through-hole, a contact-hole or a groove for a circuit is formed in the surface of the insulating layer by means of an etching process or the like. In other words, the method comprises: forming a base-metal film including a metal having a high melting point, for example a TiN film, on the semiconductor device material, that is, on the inside surface / of the recess portion of the insulating layer and on the surface of the insulating layer; adjusting a surface state of the base-metal film (surface-processing) by using a liquid or gaseous organic solvent having an OH-group; and then depositing a metal for a circuit such as aluminum or copper on the base-metal film at least on the inside surface of the recess portion, by means of a CVD method, in order to fill a part of or the whole of the recess portion.

In the method, some organic aluminum compounds such as dimethyl-aluminum-hydride (DMAH) are used as a metal for a circuit in order to form a suitable Al film. Since an outermost orbit of an aluminum atom in DMAH is vacant, DMAH is very electronphilic. Thus, decomposition of DMAH is promoted by electron supply from the base-metal film. Thus, a metal for a circuit is formed on the base-metal film. Regarding such a characteristic, a case using any organic copper compound is also the same. The base-metal film also serves as a barrier film for preventing diffusion of the metal for a circuit into the Si substrate and/or the interlayer insulating film.

The reason why the metal film having a high melting point or the metal compound having a high melting point, for example including Ti, is used as the base-metal film for the metal for a circuit is that they are stable. In addition, the metal film having a high melting point or the metal compound having a high melting point has a less reactivity to aluminum or copper used as the metal for a circuit. Thus, in various annealing processes (normally at 250 to 450° C.) that may be conducted after the circuit is formed, the metal film having a high melting point or the metal compound having a high melting point doesn't react with aluminum or copper. That is, the metal film having a high melting point or the metal compound having a high melting point is very stable. Thus, the metal film having a high melting point or a metal compound film having a high melting point can be used as a diffusion barrier film or an anti-reflection coating.

The base-metal film can be deposited by means of a sputtering method or a CVD method. Absorption (Stuck) species are formed on a surface of the deposited film because of various reasons. For example, if the surface is exposed in the atmosphere, moisture, oxygen, nitrogen or any other organic matter in the air may stick to the surface. In addition to this, in a case of a CVD film, various chemical species originating from source gases may stick to the surface. The surface of the base-metal film is contaminated by these absorption species so that surface resistance thereof is raised. Thus, electron supply from the base-metal film is obstructed, so that growth of Al or Cu as the metal for a circuit is also obstructed. Thus, good growth of aluminum or copper can not be achieved. Even if aluminum or copper is deposited, resistance between aluminum or copper and the base-metal film is raised, that is, contact resistance therebetween is increased. In addition, if cleanliness of the surface of the base-metal film on the inside surface of the recess portion is uneven, deposited thickness of aluminum or copper may vary partly. Thus, the recess portion may be partly blocked, so that a void may be generated at a portion away from the opening. Therefore, it is very difficult to satisfactorily fill the recess portion such as a hole with aluminum or copper, only by using the base-metal film.

Thus, in the method, the surface state of the base-metal film is adjusted by surface-processing by means of an organic solvent having an OH-group. The surface of the base-metal film can be uniformly covered with the organic solvent having an OH-group, by exposing the surface of the base-metal film to the organic solvent having an OH-group.

Thus, since the surface state of the base-metal film is adjusted, the whole surface state of the base-metal film including the inside surface of the recess portion is made even. Thus, a good filling characteristic can be obtained, that is, it is made possible to remove effects of a process history that has been conducted before.

In the method, the base-metal film is formed on the surface of the insulating layer and on the inside surface of the recess portion of the insulating layer, and a metal for a circuit is deposited on the base-metal film, for example by means of a whole-surface deposition CVD method. At that time, if the surface state of the base-metal film is not adjusted properly, as disclosed in the above-mentioned VLSI Symposium, the opening may be covered by the metal for a circuit deposited on the surface of the insulating film before the minute recess portion is filled up. That is, it is possible that a good filling process is not achieved.

Therefore, in the method, based on the above understanding, after the surface state of the base-metal film is properly adjusted by the process by means of the organic solvent having an OH-group, the metal for a circuit is deposited by means of the CVD method. Thus, deposition nucleuses (nucleuses for the deposition process) are uniformly formed on the whole of base-metal film including the inside surface of the recess portion, so that unevenness of the deposited film thickness is restrained. Thus, a partial filling and hence a void formation in the recess portion can be prevented, that is, the recess portion can be satisfactorily filled up with the metal for a circuit.

In the method, the metal for a circuit may be formed only by the CVD method. Alternatively, after a first metal for a circuit is formed by the CVD method, a second metal for a circuit may be formed by a sputtering method or a electroplating method. That is, the first metal for a circuit is thinly formed on the base-metal film by the CVD method, ant then the second metal for a circuit may be deposited thereon by means of the sputtering method. This can use both an advantage of the CVD method, that is, a better filling characteristic and an advantage of the sputtering method or the electroplating method, that is, a better film quality, at a time. In the case, these processes may be continuously conducted in a vacuum state. Alternatively, after the first metal for a circuit is formed and the semiconductor device material is once taken out into the atmosphere, the second metal for a circuit may be formed. In addition, as described above, aluminum or copper is suitable for the metal for a circuit. However, other low-resistance metallic materials such as gold or the like can be also used. In particular, in a case of copper, it is effective that the second metal for a circuit is formed by means of the electroplating method.

The method also makes it possible to continuously form minute and uniform nucleuses at an early stage of the deposition process to the base-metal film including the inside surface of the recess portion, by adjusting the surface state by using the organic solvent having an OH-group.

As described above, the preprocess by means of the organic solvent having an OH-group heightens the quality of a deposition state in the whole surface of the base-metal film including the recess portion, so that a partial filling and a void formation in the recess portion can be prevented, that is, the recess portion can be satisfactorily filled up with the metal for a circuit.

Such a change of the deposition characteristic caused by the surface state of the base-metal film happens only in a case of the CVD method that is greatly influenced by the state of the substrate surface. That is, as the method, by organically integrating adjustment of the surface state of the base-metal film by means of the preprocess under a suitable condition and the CVD method for the metal for a circuit, a circuit-element forming art superior in a filling characteristic to a minute recess portion can be established for the first time.

In addition, in the method, after the above preprocess is conducted on the surface of the base-metal film, a first metal for a circuit may be deposited on the base-metal film on the inside surface of the recess portion by means of the CVD method, and then the first metal for a circuit deposited on the surface of the insulating layer may be selectively removed, and then a second metal for a circuit may be deposited on a part of the insulating layer, from which the first metal for a circuit has been removed, by means of a sputtering method or a electroplating method. In the case, if a characteristic of the film by the CVD method is not good, the film is removed while only a necessary minimum thereof is left, and then another film having a better characteristic can be formed.

For example, a manufacturing unit for carrying out a part of the above method is schematically shown in FIG. 1. The manufacturing unit 2 comprises: a surface-processing unit 4 that causes a surface of a semiconductor device material to come in contact with an organic solvent having an OH-group to conduct a surface-processing; a CVD unit 6 that deposits a metal for a circuit on the surface-processed surface of the semiconductor device material by means of a CVD method; and a vacuum transferring chamber 8 communicating with the surface-processing unit and the CVD unit for example in a vacuum state.

The vacuum transferring chamber 8 and the surface-processing unit 4 are connected via a gate valve G1, and the vacuum transferring chamber 8 and the CVD unit 6 are connected via a gate valve G2, respectively. A transferring arm 12, which can retract, extend and rotate while holding a semiconductor device material 10, is provided in the vacuum transferring chamber 8 in order to transfer the material 10, for example a silicon substrate. The transferring arm 12 can move on and along a guide rail 14. A load-lock chamber 16 in which a vacuum can be created is connected to a side of the vacuum transferring chamber 8 via a gate valve G3.

The semiconductor device material to be processed is formed by depositing an insulating layer having a recess portion on a surface of a semiconductor substrate such as a silicon wafer. At first, a base-metal film such as a TiN film is formed on the surface of the semiconductor device material by means of a unit not shown. Then, the semiconductor device material on which the base-metal film has been deposited is transferred through the load-lock chamber 16 of the manufacturing unit 2 into the vacuum transferring chamber 8 in which a vacuum is maintained. The transferred material 10 undergoes a surface-process as a preprocess in the surface-processing unit 4 by means of vapor of the organic solvent having an OH-group, so that the surface state of the base-metal film is adjusted. Then, the surface-processed material 10 is transferred into the CVD unit 6 through the vacuum transferring chamber 8 in which a vacuum is maintained. Then, a metal for a circuit is deposited on the material 10 by means of the CVD method. After the CVD process is completed, the material 10 is taken out through the vacuum transferring chamber 8 and the load-lock chamber 16.

In the above unit, since the CVD unit 6 and the surface-processing unit 4 are connected via the vacuum transferring chamber 8, the surface-processed material 10 can undergo a deposition process by the CVD method without being exposed to gas such as the atmospheric air. Of course, the transferring chamber 8 may be filled with a nitrogen atmosphere of an atmospheric pressure, so that the wafer can be transferred in the nitrogen atmosphere. A liquid organic solvent having an OH-group can be also used in a surface-process. In the case, in order to conduct the surface-process, the material 10 may be soaked in the liquid organic solvent or the liquid organic solvent may be spin-coated to the surface of the material 10.

Next, concrete examples according to the method of the invention are explained together with comparisons.

EXAMPLE 1

Figure 2:
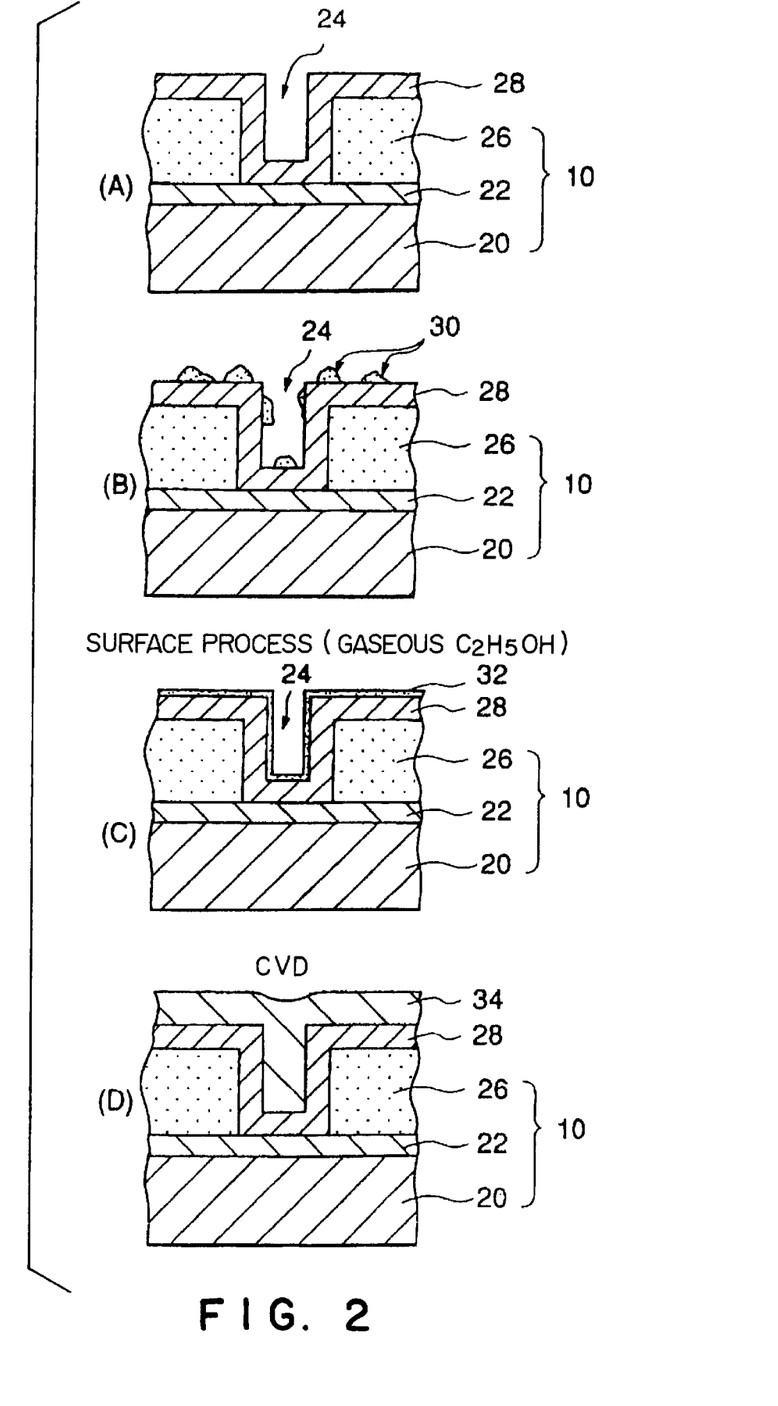
FIG. 2 is a flow chart for explaining a first embodiment of a method according to the invention.

FIG. 2 is a flow chart for explaining a first example of a method according to the invention. In the example, a case is explained wherein a contact-hole (recess portion) 24 for connecting a diffusion layer 22 formed on a semiconductor substrate 20 to an aluminum-circuit layer 34 as an upper layer is filled with aluminum in order to form a plug and wherein the aluminum-circuit layer 34 is formed as the upper layer.

At first, the diffusion layer 22 that forms various devices such as MOSFET or the like was formed on the semiconductor substrate 20. A silicon-oxide layer 26 having a thickness of 1 $\mu$m was formed as an insulating layer on the diffusion layer 22. Then, a resist-pattern was formed by means of photolithography, the contact-hole 24 having a diameter of 0.3 $\mu$m was formed by a dry etching process using a mixed gas including fluoride, and then the resist-pattern was removed. This state means the semiconductor device material 10.

Then, a titanium-nitride film 28 was deposited as a base film on the whole upper surface of the semiconductor device material 10 by a sputtering method. The thickness of the titanium-nitride film 28 was about 30 nm on a plane portion (see FIG. 2(A)). Uneven absorption species 30 were stuck to the surface of the titanium-nitride film 28 because of various reasons. The state is shown in FIG. 2(B). In FIG. 2, a gate region or another region including a field oxidation film is omitted.

Then, the material 10 as shown in FIG. 2(B) was inserted into the surface-processing unit 4 (see FIG. 1), and vapor of $C_2H_5OH$ as an organic solvent having an OH-group was introduced at a rate of 1 cc (liquid)/min for 60 sec together with a carrier gas of Ar gas. Thus, the uneven absorption species 30 on the titanium-nitride film 28 were removed, and the surface of the titanium-nitride film 28 was uniformly covered with a processed layer 32 having OH-groups. This state is shown in FIG. 2(C). It may be thought that the processed layer 32 is in a state wherein the organic solvent having an OH-group are uniformly absorbed onto the surface of the titanium-nitride film 28. Thus, the processed layer 32 may easily evaporate and disappear when it is heated at the CVD process as described below.

Then, the material 10 was introduced into the CVD unit 6 without being exposed to the atmospheric air. Then, as shown in FIG. 2(D), a circuit layer 34 was formed by depositing aluminum as a metal for a circuit by means of a CVD method using dimethyl aluminum hydride (DMAH) and hydrogen. In addition, the contact-hole 24 was completely filled therewith. At that time, DMAH was supplied while undergoing a bubbling process by hydrogen. Regarding the deposition condition, the temperature of the substrate was 204° C., the total pressure was 2.0 Torr, the partial pressure of DMAH was 0.18 Torr, the flow rate of hydrogen was 1000 SCCM, and the deposition time was 300 seconds. As a result, the thickness of the aluminum film as the circuit layer 34 formed on a plane portion was 500 nm. After the film was deposited, a section of the contact-hole was taken out by using a focused ion beam, and was observed by an electron microscope. As a result, as shown in FIG. 2(D), it could be confirmed that the contact-hole 24 was satisfactorily filled with the aluminum. In addition, it could be confirmed that the formed circuit layer 34 was thick but superior in flatness and smoothness. An electron-microscopic photograph of the surface of the above circuit layer 34 was taken, but it is explained later where the comparisons are explained.

EXAMPLE 2

Figure 3:
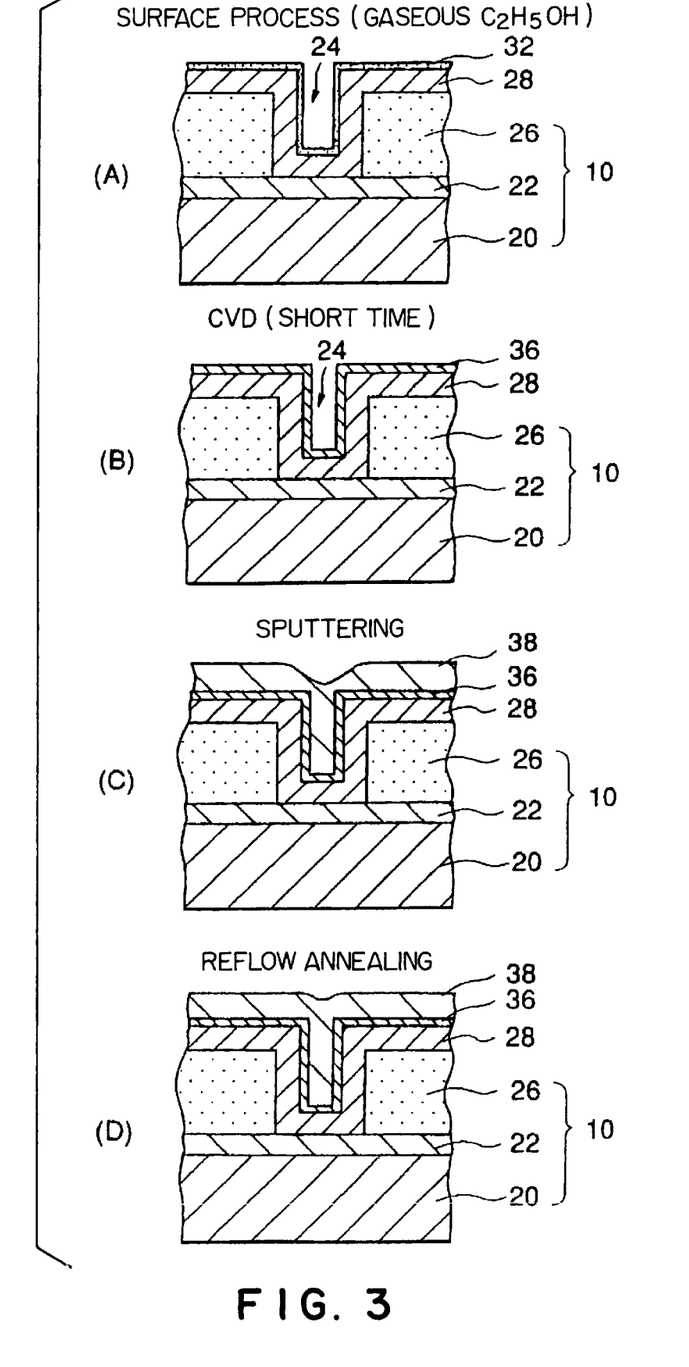
FIG. 3 is a flow chart for explaining a second embodiment of a method according to the invention.

FIG. 3 is a flow chart for explaining a second example of a method according to the invention. In the example, similarly to the example 1, a case is explained wherein a contact-hole (recess portion) 24 for connecting a diffusion layer 22 formed on a semiconductor substrate 20 to an aluminum-circuit layer as an upper layer is filled with aluminum in order to form a plug and wherein the aluminum-circuit layer is formed as the upper layer.

In the example, the same steps as the example 1 were conducted until the step of surface processing by means of the organic solvent having an OH-group. FIG. 3(A) shows a state wherein after the titanium nitride film 28 is deposited, the whole surface of the film 28 is uniformly covered with a processed layer 32 having OH-groups by the surface-process by means of the vapor of $C_2H_5OH$. FIG. 3(A) is the same as FIG. 2(C).

Then, the material 10 was introduced into the CVD unit 6 without being exposed to the atmospheric air. Then, as shown in FIG. 3(B), a circuit layer 36 was formed by depositing aluminum as a metal for a circuit by means of a CVD method using dimethyl aluminum hydride (DMAH) and hydrogen. At that time, DMAH was supplied while undergoing a bubbling process by hydrogen. Regarding the deposition condition, the temperature of the substrate was 190° C., the total pressure was 2.0 Torr, the partial pressure of DMAH was 0.18 Torr, the flow rate of hydrogen was 1000 SCCM, and the deposition time was 60 seconds. As a result, the aluminum film 36 superior in flatness and smoothness was formed in good covering performance. In addition, the contact-hole 24 was partly filled with the aluminum film 36. Herein, the thickness of the deposited film was set to about one sixth of the case of the example 1.

Next, after the aluminum film was deposited by the CVD method, the material 10 was transferred into a sputtering chamber not shown, without being exposed to the atmospheric air. Then, a circuit layer 38, whose material is the same, was formed thereon by sputtering aluminum at a stage temperature of 25° C. while using Ar gas of a pressure of 30 mTorr in such a manner that the thickness of the circuit layer 38 becomes about 500 nm on a plane portion (see FIG. 3(C)).

After that, the stage temperature of the stage, on which the wafer is placed, is increased in the same sputtering chamber, or the material 10 is transferred into a very high-vacuum annealing chamber not shown. Then, a reflow annealing process was conducted at 400° C. for 3 minutes. As a result, as shown in FIG. 3(D), a good filling characteristic could be achieved, and the circuit layers 36, 38 formed on the plane portion could have good film-quality.

As described above, after the surface-process by means of the organic solvent having an OH-group was completed, a thin aluminum film is formed by means of the CVD method by using an organic aluminum compound, and then aluminum is further deposited on the above aluminum film by the sputtering method, and then the reflow-annealing process was carried out. Thus, it could be confirmed that a plug structure superior in a filling characteristic can be formed and that a good circuit layer consisting of an aluminum film can be formed.

EXAMPLE 3

Figure 4:
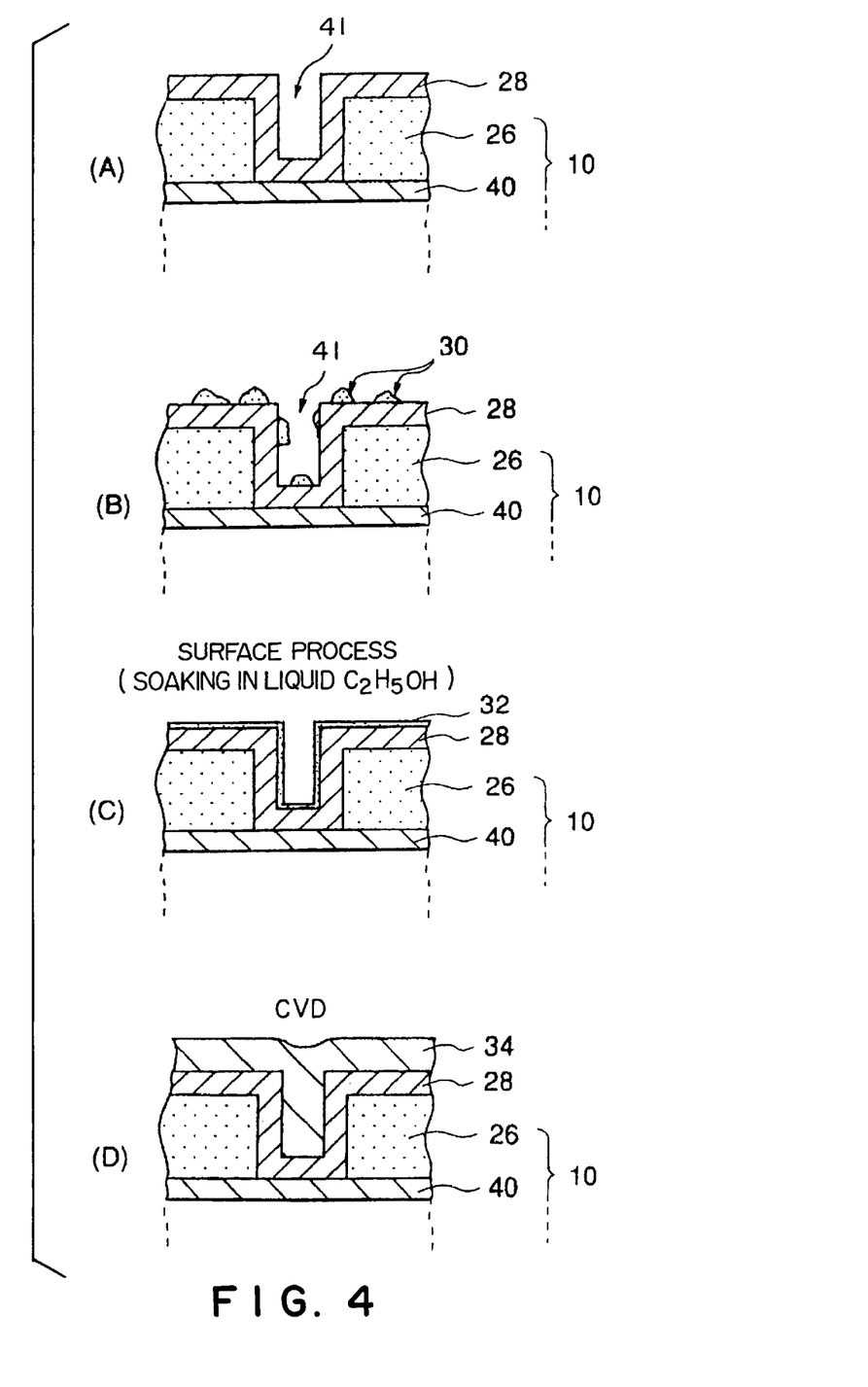
FIG. 4 is a flow chart for explaining a third embodiment of a method according to the invention.

FIG. 4 is a flow chart for explaining a third example of a method according to the invention. In the example, a case is explained wherein a through-hole (recess portion) 41 for connecting an aluminum-circuit layer as a lower layer to another aluminum-circuit layer as an upper layer is filled with aluminum in order to form a plug in multi-layer circuits in a semiconductor substrate.

The example 3 is steps of filling the through-hole for connecting the lower circuit layer, while the example 1 is steps of filling the contact-hole for contacting the diffusion layer. These steps are completely the same except a difference between the layer to be connected (example 1) and the lower circuit layer (example 3). Thus, the same reference signs are given to the same parts as shown in FIG. 1, and explanation of the same parts is omitted.

Herein, a silicon-oxide layer 26 having a thickness of 1 $\mu$m was formed as an insulating layer on a circuit layer 40 as a lower layer that has been formed on the semiconductor substrate. Then, a resist-pattern was formed by means of photolithography, the through-hole 41 having a diameter of 0.3 $\mu$m was formed by a dry etching process using a mixed gas including fluoride, and then the resist-pattern was removed. This state means the semiconductor device material 10. Then, a titanium-nitride film 28 was deposited as a base film on the whole upper surface of the semiconductor device material by a CVD method. The thickness of the titanium-nitride film 28 was about 30 nm on a plane portion (see FIG. 4(A)). Uneven absorption species 30 were formed on the surface of the titanium-nitride film 28 because of various reasons. The state is shown in FIG. 4(B).

The subsequent processes are substantially the same as the example 1 explained with reference to FIG. 2.

A surface-process in the case was conducted not by exposing the material to gaseous $C_2H_5OH$ but by soaking the material 10 in liquid $C_2H_5OH$ for 60 sec and then by drying it.

As shown in FIG. 4(D), after a circuit layer 34 consisting of an aluminum film was deposited, a section of the through-hole was taken out by using a focused ion beam, and was observed by an electron microscope. As a result, it was confirmed that the through-hole was satisfactorily filled with the aluminum.

Next, the comparisons are explained. In the following comparisons, a standard of manufacturing condition is based on the example 1, and only different conditions are explained.

Comparison 1

Figure 5:
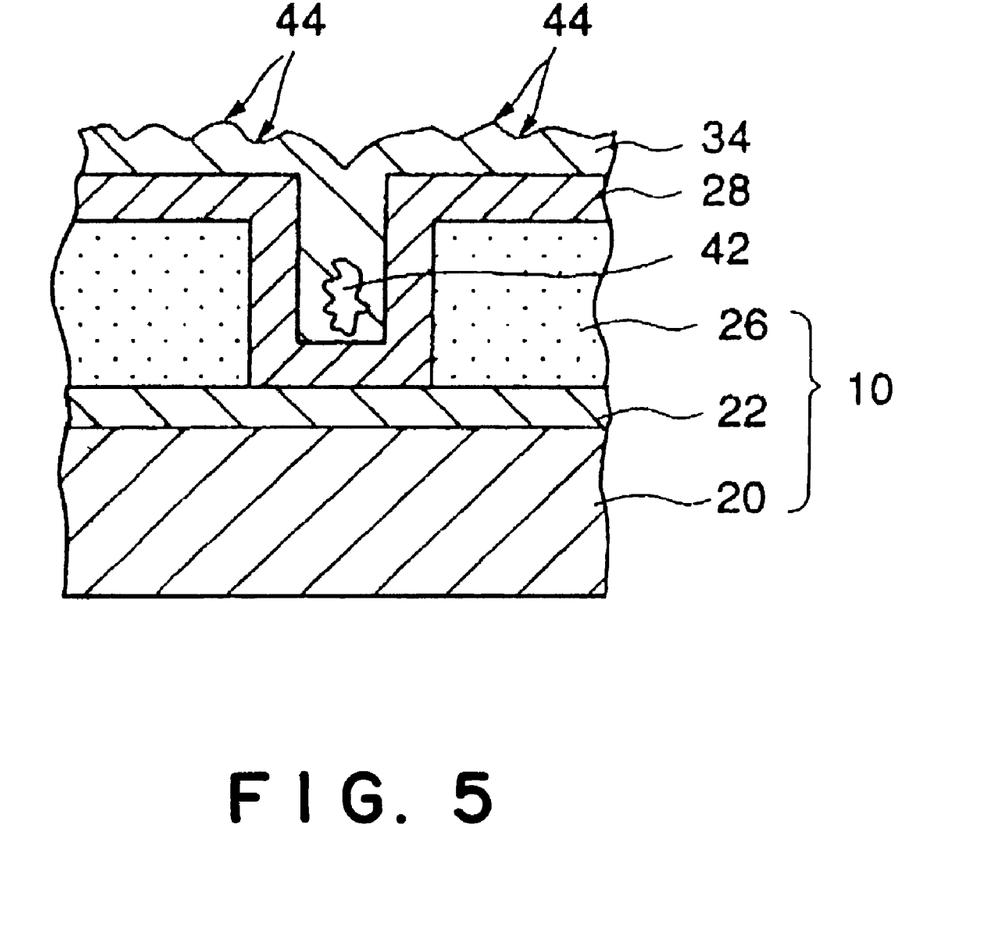
FIG. 5 is a sectional view showing a state of a filled contact-hole in a first comparison.

In the comparison 1, the surface process by means of $C_2H_5OH$ was not conducted, but the aluminum film 34 was deposited directly on the titanium nitride film 28 by a CVD method. The state of the formed sample is shown in FIG. 5(A). As shown in the drawing, the contact-hole was not filled with aluminum, but a void 42 was created. In addition, the thickness of the aluminum film 34 formed on a plane portion has an unevenness 44 of a maximum 200 nm and a minimum 100 nm, that is, it is very inferior in flatness and smoothness.

Based on an analysis of the above result, it can be confirmed that: if the surface process by means of $C_2H_5OH$ is not conducted, any change-in-quality film may be formed on the surface of the titanium nitride film, or any organic matter may be stuck thereon, or various chemical species originating in the source gas may adhere thereto, so that the surface of the titanium nitride film may be contaminated and electron supply from the base-metal film may be obstructed, and hence the growth of aluminum may be obstructed. As clearly seen from the above experimental result, it was found that the surface process according to the invention is necessary when aluminum is deposited by a CVD method.

Figure 6:
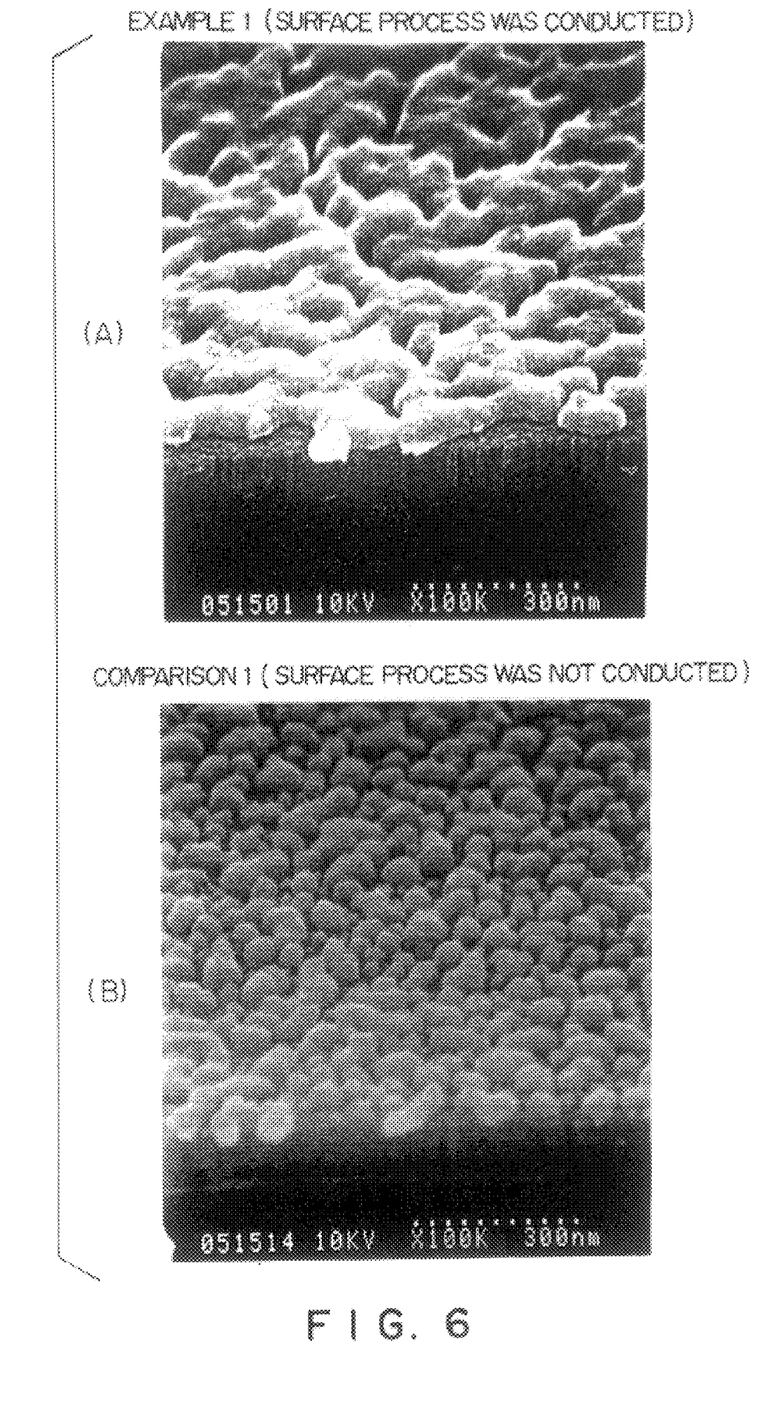
FIG. 6 shows electron microscope photographs of a surface of an aluminum circuit layer in the first embodiment and of a surface of an aluminum circuit layer in the first comparison.

An electron-microscope photograph of the surface of the aluminum circuit layer when the surface process by means of $C_2H_5OH$ had been conducted as explained in the example 1 and an electron-microscope photograph of the surface of the aluminum circuit layer when the surface process by means of $C_2H_5OH$ had been not conducted as explained in the comparison 1 were taken. These photographs are shown in FIG. 6. FIG. 6(A) shows the electron-microscope photograph of the surface of the example 1, and FIG. 6(B) shows the electron-microscope photograph of the surface of the comparison 1. It is found that the surface of the comparison 1 shown in FIG. 6(B) is not a continuous film and that the nucleus growth is slow. On the other hand, in the surface of the example 1 shown in FIG. 6(A), the nucleus grows so great that the surface state is overall relatively flat and smooth, that is, good.

Comparison 2

Figure 7:
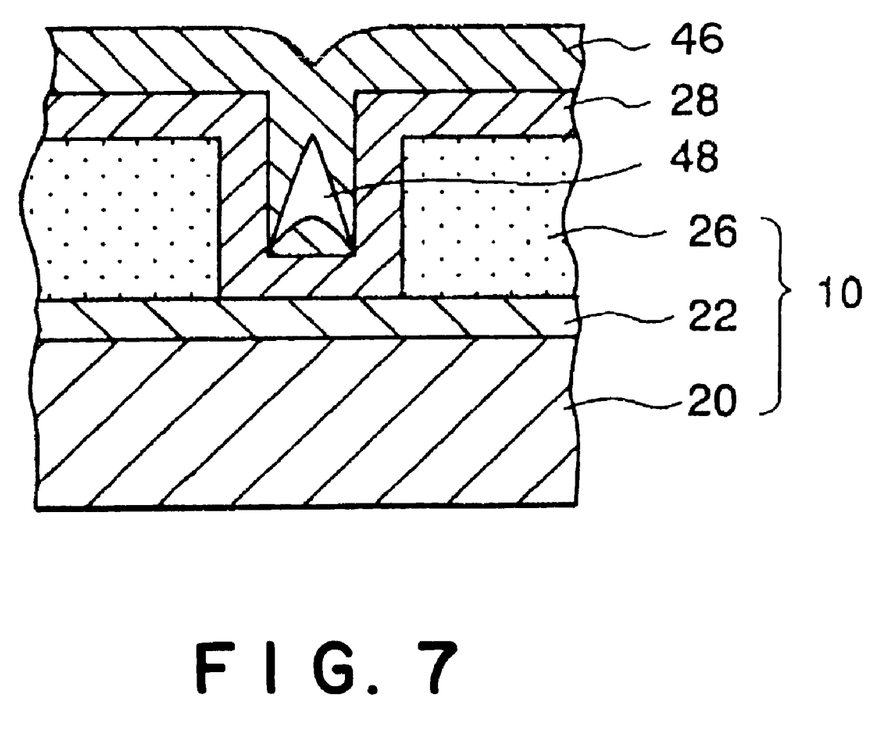
FIG. 7 is a sectional view showing a state of a filled contact-hole in a second comparison.

In the comparison 2, after a surface process by means of an organic solvent having an OH-group was conducted, an aluminum layer 46 was deposited by a sputtering method, without conducting a CVD process using any organic aluminum compound. The state of the sample is shown in FIG. 7. As shown in the drawing, a good aluminum film was deposited on a plane portion, but a void 48 was created in the contact-hole, that is, a bad filling was generated.

From the above experimental result, it was made clear that: a good filling characteristic can not be obtained by depositing aluminum by a sputtering method after the surface process by means of an organic solvent having an OH-group, and a good filling characteristic can be obtained only if a CVD method using an organic aluminum compound is conducted.

That is, when a base-metal film is formed on substantially the whole surface of an insulating film including the inside surface of a contact-hole (recess portion) and aluminum is deposited thereon, if a deposition technique such as a sputtering method that has a lower filling characteristic is used, a deposition rate on a plane portion outside the contact-hole is relatively higher than that in the inside of the contact-hole. Thus, the opening of the contact-hole may be covered with aluminum deposited on the plane portion around the contact-hole before the inside of the contact-hole is completely filled with aluminum. Thus, it is impossible to form a good filling plug when a metal for a circuit is deposited. That is, it is possible to form a good filling plug only when the surface process and the CVD process are organically united with each other.

In the case of the example 1 shown in FIG. 2, the aluminum film deposited by the CVD process was used as the circuit layer 34. However, only the plug filling the contact-hole 24 may be formed by the CVD process and the circuit layer may be formed by a sputtered film that is superior in quality and characteristic.

Figure 8:
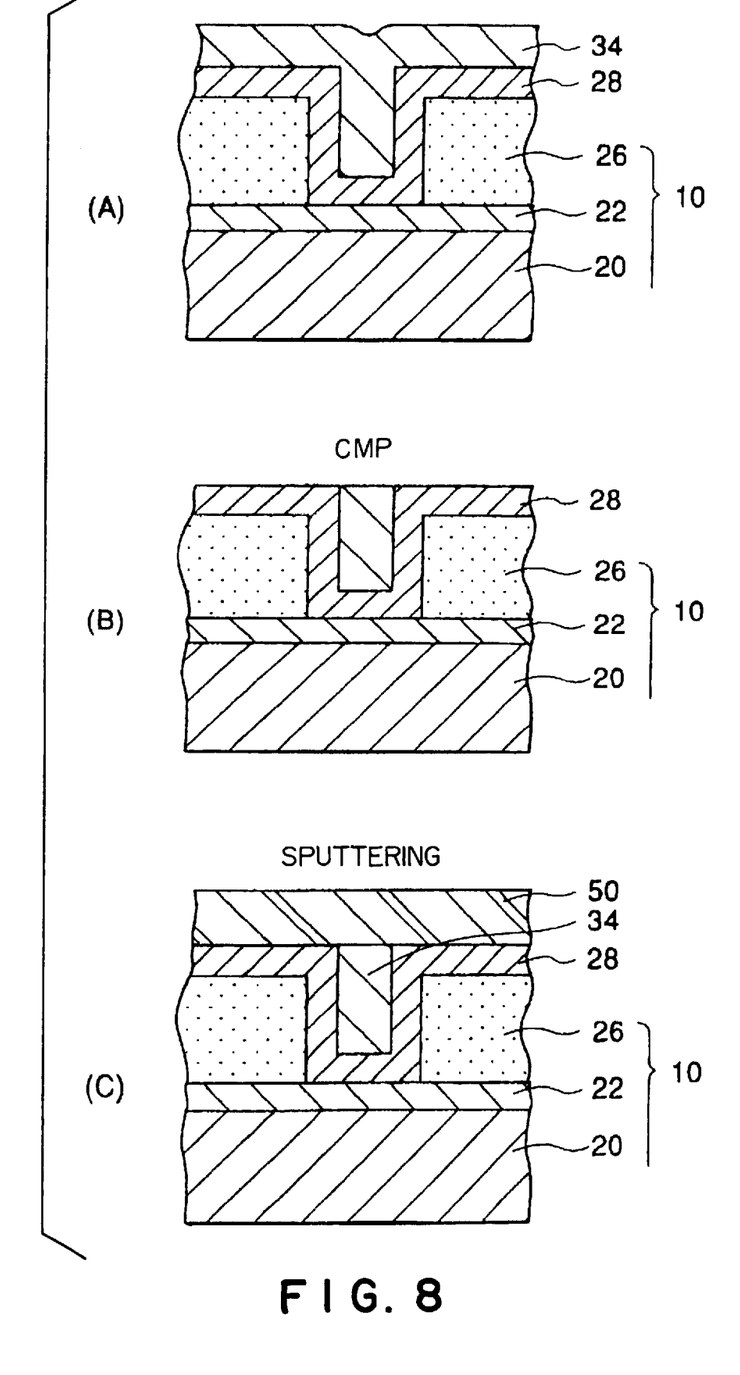
FIG. 8 is a flow chart for explaining another modified embodiment of a method according to the invention.

That is, as shown in FIG. 8(A), by the CVD process, the contact-hole is filled and the circuit layer 34 (deposited material) is formed (the circuit layer 34 may have a very thin thickness). Then, as shown in FIG. 8(B), a removing step is conducted wherein the deposited material 34 only on the plane portion is removed for example by a CMP (Chemical Mechanical Polishing) process, while leaving the deposited material of the plug portion.

Then, as shown in FIG. 8(C), a circuit layer 50 is formed by a sputtering film-forming process. In the case, the whole of the circuit layer 50 can be formed by a sputtered film that is superior in quality and characteristic.

When a groove for a circuit as a recess portion is filled, a circuit patterning process is completed at the step shown in FIG. 8(B). In the case, in particular, it is effective to use copper as a material for a circuit.

In the steps explained with reference to FIG. 8, the CVD process for depositing the aluminum film was conducted as the whole-surface deposition process (blanket), but this invention is not limited to that. For example, a selective deposition process (selective) that can form a film only in a hole may be also conducted. In the case, the removing step explained with reference to FIG. 8(B) may become unnecessary.

The organic solvent having an OH-group is not limited to ethanol. Any other organic solvent such as methanol can be used.

In FIG. 8, only the upper circuit layer 34 (deposited material) is removed flat, but this invention is not limited to that. For example, both the upper circuit layer 34 (deposited material) and the base-metal film 28 maybe removed and then both a base-metal film and a circuit layer 34 may be formed by a sputtering film-forming process.

What is claimed is:

1. A method of manufacturing a semiconductor device by forming a plurality of films on an insulating layer which has a surface in which a recess portion is partially formed, the method comprising;

a base-metal-film forming step of forming a base-metal film including a metal having a high melting point on the surface of the insulating layer including an inside surface of the recess portion, a surface-processing step of processing a surface of the base-metal film by means of an organic solvent having an OH-group, and a metal-for-circuit depositing step of depositing a metal for a circuit on the processed surface of the base-metal film by means of a CVD method in such a manner that at least a part of or the whole of the recess portion is filled up.

2. A method of manufacturing a semiconductor device according to claim 1, further comprising;

a circuit-layer forming step of forming a circuit layer by depositing a metal for a circuit by means of a sputtering method or a electroplating method, after the metal-for-circuit depositing step.

3. A method of manufacturing a semiconductor device according to claim 1, further comprising;

after the metal-for-circuit depositing step, a removing step of removing the deposited metal layer while leaving the metal for a circuit filling the recess portion, and a new circuit-layer forming step of forming a circuit layer by depositing a metal for a circuit by means of a sputtering method or a electroplating method.

4. A method of manufacturing a semiconductor device according to any of claims 1 to 3, wherein:

in the surface-processing step, a gaseous organic solvent is adapted to come in contact with the base-metal film.

5. A method of manufacturing a semiconductor device according to any of claims 1 to 3, wherein:

in the surface-processing step, a liquid organic solvent is adapted to come in contact with the base-metal film.

6. A method of manufacturing a semiconductor device according to any of claims 1 to 3, wherein:

the recess portion is a contact-hole formed in the insulating layer.

7. A method of manufacturing a semiconductor device according to any of claims 1 to 3, wherein:

the recess portion is a through-hole formed in the insulating layer.

8. A method of manufacturing a semiconductor device according to any of claims 1 to 3, wherein:

the recess portion is a groove for a circuit formed in the insulating layer.

9. A method of manufacturing a semiconductor device according to any of claims 1 to 3, wherein:

the metal for a circuit is Al or Cu.

* * * * *